United States Patent [19]
Sahagun

[11] 3,767,485
[45] Oct. 23, 1973

[54] METHOD FOR PRODUCING IMPROVED PN JUNCTION

[76] Inventor: Armen N. Sahagun, 16757 Bolera Ln., Huntington Beach, Calif. 92649

[22] Filed: Dec. 29, 1971

[21] Appl. No.: 213,290

[52] U.S. Cl. .......... 148/188, 148/187, 317/235 R, 317/234 R, 29/583
[51] Int. Cl. .......... H01l 7/36
[58] Field of Search .......... 148/188, 187; 317/235, 47.1 AK, 234, 30 T; 29/583

[56] References Cited

UNITED STATES PATENTS

| | | | |
|---|---|---|---|
| 2,975,080 | 3/1961 | Armstrong | 148/188 |
| 3,573,115 | 3/1971 | Topas | 148/188 X |
| 3,592,705 | 7/1971 | Kawashima et al. | 148/187 |
| 3,669,768 | 6/1972 | Beadle et al. | 148/187 |
| 3,346,428 | 10/1967 | Teramoto et al. | 148/188 |

*Primary Examiner*—G. T. Ozaki
*Attorney*—Spensley, Horn & Lubitz

[57] ABSTRACT

A novel method for producing improved PN junctions of the diffusion type, having wide applicability in the field of semiconductor devices. PN junctions produced by the method of this invention possess superior characteristics, including reduced leakage, higher breakdown voltage and reduced surface inversion effects. The present invention substantially reduces the level of contaminants which, heretofore, were typically trapped in the vicinity of PN diffusion junctions, adversely affecting the quality of the junctions. In this novel method, diffusion of the junction and oxidation of the surface take place concurrently in a single heating step which takes place after the step of cutting or etching mesas in the semiconductor structure.

1 Claim, 3 Drawing Figures

PATENTED OCT 23 1973 3,767,485

ARMEN N SAHAGUN
INVENTOR.

BY Spensley, Horn & Lubitz
ATTORNEYS

METHOD FOR PRODUCING IMPROVED PN JUNCTION

BACKGROUND OF THE INVENTION

1. Field of the Invention

This invention relates generally to semiconductor devices and, more particularly, to a method for producing improved PN junctions of the diffusion type.

2. Prior Art

It has heretofore been known how to produce PN junctions by diffusion, both in mesa and planar semiconductor devices. However, the methods of the prior art have been inadequate in respect to preventing or substantially reducing the level of contaminants introduced into the vicinity of the junctions during their production.

By the methods of the prior art, mesa devices having PN diffused junctions have typically been produced by the following basic sequence of steps: (i) deposition of an oxide which acts as a source of dopant of one conductivity type, e.g., N, upon a parent wafer of a second conductivity type, e.g., P; (ii) diffusion of a plurality of PN junctions by heating in a suitable environment; (iii) forming a plurality of mesas in the resulting semiconductor structure by a process of cutting or etching; and (iv) passivation of the junctions. Since the PN junctinons are diffused prior to the step of forming the mesas, the exterior regions of the junctions are typically contaminated by a residue of materials present or introduced during the process of cutting or etching the mesas. In addition, prior to their passivation, the exterior regions of each junction remain exposed to additional contamination. Consequently, great care is required of those practicing the above-described method of the prior art in order to keep the exterior regions of the junctions clean. Despite the care and the measures taken, however, contaminants often remain trapped in the vicinity of the exterior regions of the junctions causing degradation of their quality. The degradation of quality is manifested by relatively high leakage, low breakdown voltage and surface inversion. A further disadvantage of this method, of course, is the increased cost attributable to the efforts to keep the junctions clean.

The prior art has also taught methods for producing planar devices having PN junctions formed by diffusion. These methods typically include the following basic sequence of steps: (i) oxidation of the top surface of a parent wafer of one conductivity type, e.g., P; (ii) cutting a plurality of planar windows through the oxide layer, typically by a photo-resist process; (iii) deposition of a dopant source, typically an oxide which provides dopant of a second conductivity type, e.g.,N, over the surface of the structure; and (iv) diffusion of a plurality of N regions through the windows to form a plurality of PN junctions. By this method of producing planar PN junctions, however, contamination is introduced and the quality of the resulting junctions degraded. Firstly, the top surface of the parent wafer must be highly polished and very clean prior to its oxidation. Often this cannot be satisfactorily achieved, and as a result, contaminants become trapped in the oxide layer. Secondly, an imperfect cut of the planar windows, typically caused by poor resolution of the photoresist process used, entraps contaminants in the corners of the planar windows, contaminants which often remain despite the measures taken to remove them. Another source of contamination is the residue of the materials used during the phoho-resist process and those used afterwards to remove the photo-resist chemicals. In addition, prior to the step of depositing the dopant source over the surface of the structure, the area within the planar window remains exposed to further contamination. Subsequently, during the diffusion step when the junctions are being formed, these trapped contaminants distribute themselves into the vicinity of the junctions and, thereby, adversely affect their overall quality. Thus the PN junctions produced by this method of the prior art often exhibit high leakage, low breakdown voltage,and surface inversion as well as contaminated oxide layers.

A further disadvantage of this prior art method of producing planar PN junctions relates to the inability to entirely remove the original oxide layer during the cutting of the planar windows. This is due to "pin holes", i.e. particles, within the photo-resist layer which block the light during the photo-resist process. As a result, oxide residues remain within the windows adversely affecting the quality of the PN junctions, particularly large area junctions.

The present invention overcomes these shortcomings and limitations of the prior art in that it discloses a method for producing improved PN junctions which substantially eliminates the sources of contamination which heretofore have degraded the quality of the PN junctions produced. This invention teaches the novel step of concurrently diffusing the junctions and oxidizing the upper surface of the wafer after, not before, the forming of mesas in the semiconductor structure. Thus, during this step, the junctions drive in below a new and clean oxide layer and away from the surface thereby enabling junctions to form which are substantially cleaner and of higher quality than has heretofore been produced. The problems of surface contamination and damage which have limited the quality of mesa junctions produced by the prior art are substantially mitigated because the present invention teaches (i) the cutting or etching of the mesas before the diffusion of the junctions, and (ii) the forming of the junctions away from the cut surfaces. similarly, the above-described disadvantages associated with the production of planar PN junctions are substantially eliminated. There is no cutting of planar windows,and the contamination typically introduced by such cutting is avoided. In addition, the adverse affects of a residue of oxide material within the windows, due to the presence of pin holes in the photo-resist layer, is likewise avoided because the invented method does not require the cutting of the planar windows.

Another advantage of the method of the present invention is that there is no time, after the junctions are formed, during which their exterior regions are exposed to the external environment and thus to additional contamination. This is because of the novel step of diffusing the junction while concurrently oxidixing a new and relatively clean oxide layer.

A further advantage of the present invention over the prior art relates to its teaching of the growth of a fresh oxide layer during the diffusion of the junctions. In the prior art method of producing planar PN junctions, for example, the oxide layer is formed before the junctions are diffused. Thus, whether the oxide layer is relatively clean or contaminated, it remains part of the structure, and if contaminated, there is no way to eliminate the contaminants.

The present invention also has economic advantages over the methods of the prior art. Firstly, it does not require the parent wafer to be as highly polished or as clean as is typically required by the prior art method for producing planar PN junctions. Secondly, the care and expense related to keeping the exposed exterior regions of mesa junctions free of contamination prior to passivation are substantially eliminated.

BRIEF SUMMARY OF THE INVENTION

The present invention provides a novel method for producing improved PN junctions by diffusion. The invented method enables the production of PN junctions having superior characteristics relative to those heretofore possible, including lower leakage, higher breakdown voltage, and reduced surface inversion. The superior characteristics of junctions produced by the method herein disclosed are achieved by substantially reducing the level of cantaminants and oxides trapped in the vicinity of the junctions during their production - contaminants and oxides which adversely affect the quality of the resulting junctions.

A suitable dopant source, containing dopant material of a particular conductivity type, typically N, is first deposited on the surface of a silicon parent wafer, which has been doped so as to be of the opposite conductivity type, typically P. For reasons which will become evident as the present invention is further described, the surface conditions of the wafer are not critical; i.e., no polishing of the wafer surface is required, ordinary lapping being adequate. During the deposition step partial diffusion of the dopant into the wafer takes place. In a second step, a plurality of mesas is cut into the upper surface of the semiconductor structure by methods known in the art such as, for example, etching. Next, the semiconductor structure is placed in an atmosphere of 50 percent oxygen and 50 percent nitrogen by volume and heated at a temperature in the range from 1,150° to 1,275° C. for a period anywhere from 30 minutes to 100 hours. During this step the dopant material diffuses further into the silicon wafer, forming PN junctions while the outer surfaces of the mesas and the surfaces between the mesas oxidize. The higher the temperature and the longer the time of heating, the deeper the junctions drive into the wafer. Thus, the junctions are formed away from the outer surfaces and below a freshly oxidized layer of silicon dioxide. As a result, they are substantially free of the surface contaminants which typically result from exposure, handling and- ,most significantly, from the processes of cutting the mesas or the planar windows in mesa and planar devices respectively. The junctions produced by this method, therefore, are of superior quality.

Thus it is a principal object of this invention to provide a method for producing superior PN junctions having lower leakage, higher breakdown voltage and reduced surface inversion.

Another object of this invention is to provide an effective and economical method for substantially reducing the level of contaminants in the vicinity of PN junctions.

A further object of the present invention is to diffuse PN junctions under a freshly oxidized layer of silicon diozide.

The novel features which are characteristic of the present invention as well as other objects and advantages thereof will be better understood from the following detailed description, reference being had to the accompanying drawings in which a presently preferred embodiment of the invention is illustrated by example.

DETAILED DESCRIPTION OF THE INVENTION

Figure 1:
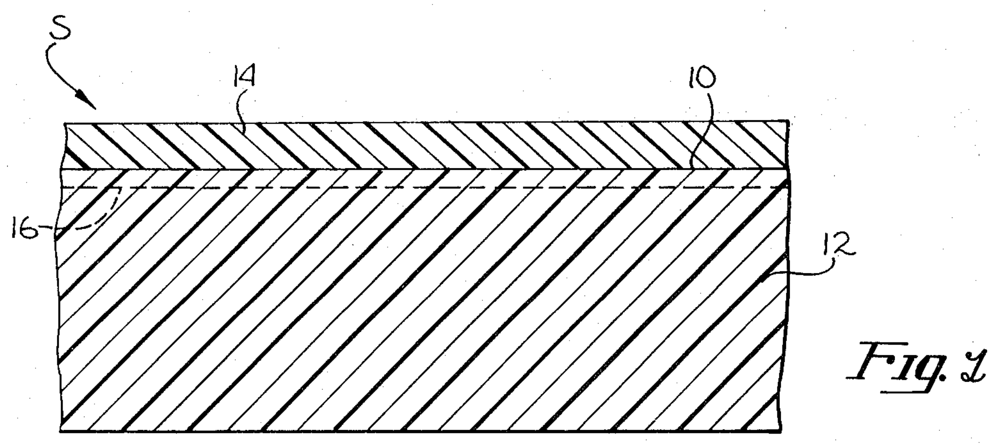
FIG. 1 is a cross-sectional view of a portion of a semiconductor structure depicting a source of dopant material deposited over the top of a parent wafer.
Figure 2:
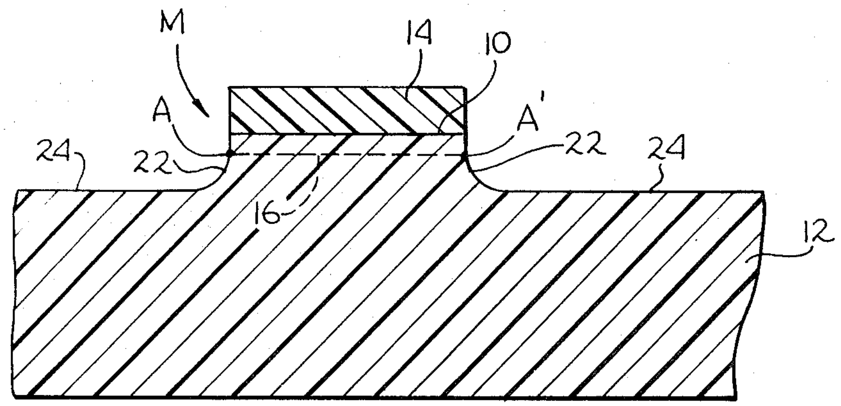
FIG. 2 is the cross-sectional view of FIG. 1 after a mesa is formed in the semiconductor structure.
Figure 3:
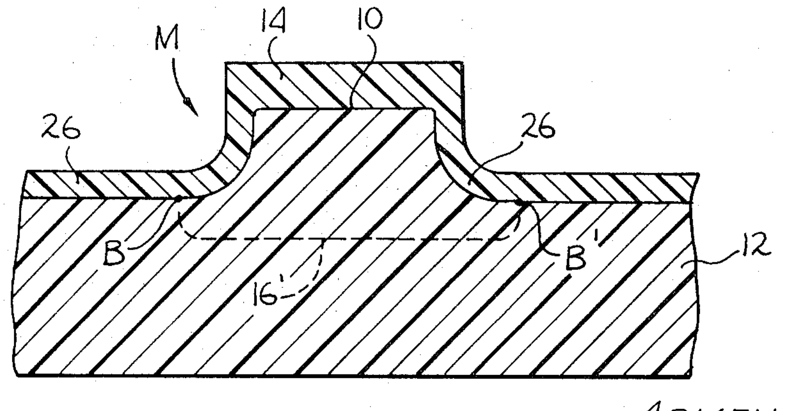
FIG. 3 is the cross-sectional view of FIG. 1 after the diffusion of a junction therein.

With reference to FIGS. 1–3, the method of the present invention will now be described in detail.

A first step of the invented method is to deposit over the top surface 10 of a parent wafer 12 a layer of a suitable material 14 containing dopant material of a particular conductivity type, typically N. The layer of dopant source 14 is typically silicon dioxide doped by techniques known in the art so as to achieve certain desired junction characteristics. The parent wafer 12 is typically a doped monocrystalline planar substrate of silicon of a conductivity type opposite that of the dopant source 14; i.e. P type, if the dopant source 14 is of N conductivity type. On the other hand, if the latter is of P conductivity type, the parent wafer 12 would be of N conductivity type. No polishing of the surface 10 is required, ordinary lapping being adequate. During this first deposition step, partial or limited diffusion of dopant from the layer of dopant source 14 into the wafer 12 takes place. The incipient junction is depicted in FIGS. 1 and 2 by the dashed line designated by the numeral 16.

A second step of the present invention is to form a plurality of mesas in the semiconductor structure S of FIG. 1. One such mesa M is shown in FIG. 2. The mesas are formed by conventional cutting or etching methods utilizing appropriate masks. The exterior regions of the incipient junction 16, formed by the partial diffusion of dopant during the first deposition step, are located at points A and A′ on side surfaces 22 of mesa M.

In a third step the entire semiconductor conductor structure S, having a plurality of mesas such as mesa M cut into its upper surface, is heated in an atmosphere typically comprised of oxygen and nitrogen in substantially equal proportions by volume. During this heating step the dopant material in the source layer 14 diffuses further into the silicon wafer 12 forming a PN junction 16′ as shown in FIG. 3. At the same time the side surfaces 22 of the mesa M and surfaces 24 between the mesas are oxidized forming a fresh silicon dioxide layer 26 as shown in FIG. 3. Equal proportions by volume of oxygen and nitrogen, in the range of the temperatures used, have been found to yield a silicon dioxide layer 26 having a suitable thickness and porosity. This allows very long diffusion durations without significant degradation of the oxide layer 26. In addition, appropriate thickness is important in that too thin an oxide layer is less impervious to moisture and other contaminants, while too thick an oxide layer tends to peal off or crack.

The temperature of the heat soak is in the range from 1,150° to 1,275° C. while the duration of the heat soak can be from 30 minutes to as high as 100 hours, both temperature and duration being functions of the depth of diffusion desired. Persons skilled in the art will be able to select the appropriate combination of temperature and heat duration required for particular applications. Of course, the higher the temperature and the longer the duration of the heat soak, the deeper the junction 16' drives into the wafer 12.

During the heating step, while the diffusion of dopants into the silicon wafer 12 is taking place, the exterior regions of the junction 16' move increasingly away from points A and A' toward points B and B' respectively; i.e., increasingly away from the exposed outer surfaces 22 and 24. Point B and B' are located beneath a freshly grown layer 26 of silicon dioxide. At no time is the final junction 16' exposed to the external environment. Likewise, none of the contaminants remaining after the cutting of the mesa M are trapped in the vicinity of points B and B', nor can they diffuse to these points in any significant quantity. The diffusion of the dopant to points B and B' concurrently with the growth of a fresh layer 26 of silicon dioxide assures a substantially contaminant-free junction 16' at its exterior regions B and B'.

In a presently preferred manner of practicing this invention, the parent wafer 12 is a silicon wafer doped so as to be of N conductivity type. Its resistivity is approximately 10 ohm-centimeters. The layer of dopant source 14 is typically boron doped glass; i.e., the source 14 contains a dopant which, when diffused into the wafer 12, will cause the wafer to change to P conductivity type in the diffusion region. The layer of dopant source 14 is typically 5,000 A in thickness and has a resisitivity of about 0.02 ohm-centimeters. The deposition of the layer of dopant source 14 takes place at about 1,200° C. The mesas M, which are formed during the second step of the present invention, are typically 0.250 × 0.250 inch sections. The diffusion step is carried out at a temperature of about 1,275° C for approximately 30 hours, driving the junction to an approximate depth in excess of 2.5 mils. The PN junctions produced by this preferred method typically have the following electrical characteristics:

a. Breakdown Voltage: 1,100 volts (whereas, the breakdown voltages of PN junctions produced by prior art methods are typically 300–400 volts.)

b. Gain: 20, with 10 amperes of collector current; thus, 4 volts at the base produces a collector to base voltage of 800 volts.

Although this invention has been disclosed and described with reference to a particular embodiment, the principals involved are susceptible to other applications which will be apparent to persons skilled in the art. This invention, therefore, is not intended to be limited to the particular embodiment herein disclosed.

I claim:

1. A method of making a semiconductor junction comprising the steps of:

a. providing a planar substrate of silicon of a first conductivity type, said substrate having a lapped top surface;

b. depositing over said top surface of said substrate of silicon a layer of doped glass containing a dopant which, when diffused into said substrate, cause a region thereof to be of a second conductivity type opposite that of said first conductivity type;

c. removing portions of said substrate of silicon and said layer of doped glass so as to form a plurality of mesas in the structure comprised of said substrate of silicon and said layer of doped glass; and d. heating said structure in at atmosphere comprised of substantially equal portions of oxygen and nitrogen by volume at a temperature in the range from 1,150°to 1,275°C for a duration in the range from 30 minutes to 100 hours, causing said dopant to diffuse into said substrate of silicon to form a junction between the regions of opposite conductivity type therein, and causing concurrently a layer of fresh silicon dioxide to grow over the exposed surface of said structure, said junction terminating beneath said layer of silicon dioxide in a substantially contaminant-free region of said substrate, said temperature and duration being a function of the depth to which said junction is driven.

* * * * *